US008970286B2

(12) United States Patent  
Reshetnyak et al.

(10) Patent No.: US 8,970,286 B2  
(45) Date of Patent: Mar. 3, 2015

(54) MATRIX-STAGES SOLID STATE ULTRAFAST SWITCH

(71) Applicant: Silicon Power Corporation

(72) Inventors: Boris Reshetnyak, North Wales, PA (US); Dante E. Piccone, Glenmoore, PA (US); Victor Temple, Clifton Park, NY (US)

(73) Assignee: Silicon Power Corporation, Clifton Park, NY (US)

( * ) Notice: Subject to any disclaimer, the term of this patent is extended or adjusted under 35 U.S.C. 154(b) by 0 days.

(21) Appl. No.: 14/044,356

(22) Filed: Oct. 2, 2013

(65) Prior Publication Data

US 2014/0035655 A1    Feb. 6, 2014

Related U.S. Application Data

(63) Continuation of application No. 13/273,767, filed on Oct. 14, 2011, now Pat. No. 8,575,990.

(51) Int. Cl.

| | |
|---|---|
| *H03K 17/74* | (2006.01) |
| *H03K 17/04* | (2006.01) |
| *H03K 3/57* | (2006.01) |
| *H03K 17/12* | (2006.01) |
| *H03K 17/10* | (2006.01) |
| *H03K 17/60* | (2006.01) |

(52) U.S. Cl.  
CPC ............ *H03K 17/60* (2013.01); *H03K 17/0403* (2013.01); *H03K 3/57* (2013.01); *H03K 17/125* (2013.01); *H03K 17/105* (2013.01)  
USPC .......................................... 327/421; 327/427

(58) Field of Classification Search  
USPC .................. 327/50, 74, 76, 421, 427, 434  
See application file for complete search history.

(56) References Cited

U.S. PATENT DOCUMENTS

| | | | |
|---|---|---|---|
| 4,692,643 | A | 9/1987 | Tokunaga et al. |
| 5,180,963 | A | 1/1993 | El-Sharkawi et al. |
| 5,444,610 | A | 8/1995 | Gaudreau et al. |
| 5,646,833 | A | 7/1997 | Gaudreau et al. |
| 5,710,463 | A | 1/1998 | Vogel et al. |
| 5,933,335 | A | 8/1999 | Hitchcock et al. |

(Continued)

FOREIGN PATENT DOCUMENTS

| | | |
|---|---|---|
| DE | 102008034688 A1 | 1/2010 |
| JP | H05103486 A | 4/1993 |

*Primary Examiner* — Hai L Nguyen  
(74) *Attorney, Agent, or Firm* — Blank Rome LLP (57) ABSTRACT

A semiconductor switching device for switching high voltage and high current. The semiconductor switching device includes a control-triggered stage and one or more auto-triggered stages. The control-triggered stage includes a plurality of semiconductor switches, a breakover switch, a control switch, a turn-off circuit, and a capacitor. The control-triggered stage is connected in series to the one or more auto-triggered stages. Each auto-triggered stage includes a plurality of semiconductor switches connected in parallel, a breakover switch, and a capacitor. The control switch provides for selective turn-on of the control-triggered stage. When the control-triggered stage turns on, the capacitor of the control-triggered stage discharges into the gates of the plurality of semiconductor switches of the next highest stage to turn it on. Each auto-triggered stage turns on in a cascade fashion as the capacitor of the adjacent lower stage discharges or as the breakover switches of the auto-triggered stages turn on.

26 Claims, 3 Drawing Sheets

(56) References Cited

U.S. PATENT DOCUMENTS

| | | |
|---|---|---|
| 6,396,672 B1 | 5/2002 | Deam |
| 6,624,684 B2 | 9/2003 | Glidden |
| 6,710,994 B1 | 3/2004 | Deam |
| 7,072,196 B1 | 7/2006 | Glidden et al. |
| 7,821,319 B2 | 10/2010 | Thiele |
| 7,868,352 B2 | 1/2011 | Giorgi et al. |
| 7,944,268 B2 | 5/2011 | Okanobu |
| 8,228,113 B2 | 7/2012 | Domes |
| 8,575,990 B2 * | 11/2013 | Reshetnyak et al. .......... 327/421 |

* cited by examiner

MATRIX-STAGES SOLID STATE ULTRAFAST SWITCH

RELATED APPLICATIONS

This application is a continuation of U.S. patent application Ser. No. 13/273,767, filed on Oct. 14, 2011, now U.S. Pat. No. 8,575,990, which issued Nov. 5, 2013, the entire contents of which are hereby incorporated by reference.

FIELD OF THE INVENTION

The present invention relates to a solid state switch and, more specifically, to a solid state switch having a plurality of switch levels connected in series, each level having a plurality of semiconductors connected in parallel and to a method of triggering the solid state switch.

BACKGROUND OF THE INVENTION

Switching high current and high voltage is required in some applications in military, medical, and commercial devices and systems. Depending upon on the application, a switching device may be required to switch tens of kilovolts and tens of kiloamperes. Devices for switching such high current and high voltage have been proposed to include a plurality of levels connected in series, each level having a plurality of high-power semiconductor switching devices connected in parallel. Each semiconductor includes a gate and a driver of the gate. To control these devices, the gate driver has special requirements such as high voltage isolation between levels, minimum delay time in gate pulses from one level to another, overvoltage protection, and sharing voltage protection.

Many drive circuits use pulse transformers in the gate circuitry to isolate one level of the switch from another. Because the switch comprises many semiconductors in series and in parallel, these pulse transformers become very large, costly, and impractical. In addition pulse transformers must be shielded to avoid external magnetic field pick up which could create unwanted low level gate pulses and, as a result, cause misfiring, which may destroy devices connected to the switch.

In response, methods have been developed using power stored in a capacitor floating with the device for the trigger energy. These methods use low-power triggers for a low-power solid state device that discharges the capacitor into the gate of the high-power semiconductor switching device. While still requiring a pulse transformer, because of the lower energy requirements in the gate circuitry, the switching device can be smaller. General examples of these switching devices are described in U.S. Pat. Nos. 5,444,610 and 5,646,833.

Other methods for switching the high-power semiconductor switching devices have been proposed. U.S. Pat. Nos. 6,396,672 and 6,710,994 describe a power electronic switch circuit that includes a silicon-controlled rectifier and a gate trigger circuit coupled to the gate of the silicon-controlled rectifier (SCR). A snubber capacitor is coupled to the anode and cathode of the SCR. Energy stored in the snubber capacitor provides the necessary energy to power the gate trigger circuit to trigger the SCR.

U.S. Pat. No. 6,624,684 describes a compact method for triggering thyristors connected in series using energy stored in a pulse forming network coupled to the gate of each thyristor. Each pulse forming network is coupled to a snubber circuit that, together with the pulse forming network, acts as a snubber capacitor to limit the dv/dt imposed on the thyristor, thereby preventing spurious turn-on of the thyristor. The pulse forming network provides current to the gate of the thyristor through a gate switch to turn on the thyristor while the snubber circuit provides a source of fast rising current to the anode of the thyristor to speed up turn-on as it discharges through the anode of the thyristor. Either a low-power electrical signal through a pulse transformer or an optical signal can be used to trigger the gate switch.

U.S. Pat. Nos. 5,933,335 and 5,180,963 provide examples of an optically triggered switch. In U.S. Pat. No. 5,180,963, there is described an optically triggered solid state switch. The switch uses an optical signal for each set of two high power solid state devices. The optical signal triggers a phototransistor, which in turn triggers a low power solid state device. The low power solid state device then discharge a capacitor through a pulse transformer, producing signals in the gates of two high power solid state devices to turn on the devices.

U.S. Pat. No. 7,072,196 describes a method of turning on a high voltage solid state switch that comprises a set of solid state devices, such as thyristors, connected in series. The switch comprises a snubber circuit coupled to the anode and cathode of each solid state device to speed up turn-on.

SUMMARY OF THE INVENTION

According to an exemplary aspect of the present invention there is provided a semiconductor switching device having a control-triggered stage and one or more auto-triggered stages connected in series. The control-triggered stage includes one or more semiconductor switches connected in parallel, a breakover switch comprising a first end and a second end, and a control switch connected across the breakover switch. Each semiconductor switch includes a power input, a power output, and a control input. The first end of the breakover switch is coupled to the power input of each semiconductor switch, and the second end of the breakover switch is coupled to the control input of each semiconductor switch. Each auto-triggered stage includes one or more semiconductor switches connected in parallel and a breakover switch comprising a first end and a second end. Each semiconductor switch of each auto-triggered stage includes a power input, a power output, and a control input. The first end of the breakover switch of the each auto-triggered stage is coupled to the power input of each semiconductor switch of the each auto-triggered stage, and the second end of the breakover switch of the each auto-triggered stage is coupled to the control input of each semiconductor switch of the each auto-triggered stage. The control-triggered stage is connected in series with the one or more auto-triggered stages.

According to another exemplary aspect of the present invention there is provided a high voltage circuit having an energy storage device, a load, a power supply coupled across the energy storage device, and a semiconductor switching device for coupling the energy storage device across the load. The semiconductor switching device includes a control-triggered stage and one or more auto-triggered stages connected in series. The control-triggered stage includes one or more semiconductor switches connected in parallel, a breakover switch comprising a first end and a second end, and a control switch connected across the breakover switch. Each of the semiconductor switches includes a power input, a power output, and a control input. The first end of the breakover switch is coupled to the power input of each semiconductor switch, and the second end of the breakover switch is coupled to the control input of each semiconductor switch. Each auto-triggered stage includes one or more semiconductor switches connected in parallel and a breakover switch comprising a first end and a second end. Each semiconductor switch of each auto-triggered stage includes a power input, a power output, and a control input. The first end of the breakover switch of the each auto-triggered stage is coupled to the power input of each semiconductor switch of the each auto-triggered stage, and the second end of the breakover switch of the each auto-triggered stage is coupled to the control input of each semiconductor switch of the each auto-triggered stage. The control-triggered stage is connected in series with the one or more auto-triggered stages.

BRIEF DESCRIPTION OF THE DRAWINGS

For the purpose of illustration, there are shown in the drawings certain embodiments of the present invention. In the drawings, like numerals indicate like elements throughout. It should be understood, however, that the invention is not limited to the precise arrangements, dimensions, and instruments shown. In the drawings.

DETAILED DESCRIPTION OF THE INVENTION

As described above, various conventional high voltage, high current solid state switches have been proposed. Some of the conventional high voltage, high current solid state switches comprise one or more solid state devices, such as thyristors, across which a snubber circuit is coupled. The snubber circuit facilitates turn-on of the solid state device but limits using an insulated-gate bipolar transistor (IGBT) or a metal oxide field effects transistor (MOSFET) as the solid state devices because IGBTs and MOSFETs are normally used in snubberless circuits.

Other conventional high voltage, high current solid state switches use pulse transformers to drive the one or more solid state devices. Pulse transformers, however, are not desirable as they increase the inductance of the solid state switches. Further, the primary winding wire of the trigger transformer conducts the same current that the one or more solid state devices conduct. With wide pulse duration and high load current, the primary winding wire becomes very thick, and the trigger transformer becomes very big and insufficient.

The conventional solid state switches which use snubber circuits or pulse transformers are disadvantageous for additional reasons. Typically, a solid state switch operates in a very narrow range of voltage, usually between $V_{switch} - V_{switch}/N_{levels}$ and $V_{switch}$. The value of the snubber parameters and the design of the trigger transformer must be selected to avoid auto triggering of the switch during the charging phase. Unwanted turn-on may happen if any unexpected voltage spikes in initial dv/dt occur.

In all of the above-mentioned switches, pulse transformers, multiple phototransistors, and other components are required for each high power solid state device being triggered. With many semiconductors in series and in parallel, the multitude of triggering devices required become very large, thereby increasing the cost, size, and expense of the solid state switch. The size and expense may become impractical if the number of solid state devices is large. Furthermore, if pulse transformers are use, the pulse transformers must be shielded to avoid external magnetic field pick-up, which could create unwanted low-level gate pulses and, as a result, cause misfiring and destroy the solid state devices. Shielding further increases the size and expense of the solid state switch.

Figure 1:
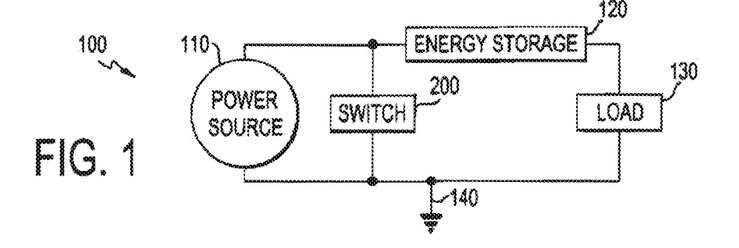
FIG. 1 illustrates an exemplary embodiment of a system for providing pulsed power to a load, the system comprising a power source, an energy storage device, and a semiconductor switching device, in accordance with an exemplary embodiment of the present invention.

Referring now to FIG. 1, there is illustrated a system 100 for use in a pulsed power application, in accordance with an exemplary embodiment of the present invention. The system 100 comprises a power source 110, an energy storage device 120, a load 130, and a switch 200. The power source 110 is coupled to the energy storage device 120 and to ground 140. The switch 200 is coupled to the energy storage device 120 and to ground 140. The load is coupled to the energy storage device 120 and to ground 140.

During use of the system 100, the switch 200 is initially open, and the power source 110 charges the energy storage device 120. When the energy storage device 120 has been charged to a desired level, the power source 110 may be disabled or disconnected from the device 120.

When power is desired to be delivered to the load 130, the switch 200 is closed, and the charge stored in the energy storage device 120 discharges into the load 130. The charging time of the energy storage device 120 may be two or more orders of magnitude greater than the discharge time thereof. Thus, the current supplied to the load via the switch 200 may be many times that of the current supplied to the energy storage device 120 during charge up by the power source 110. Exemplary embodiments of the energy storage device 120 include one or more capacitors, one or more transmission lines, or a pulse forming network. Exemplary values of the voltage and current provided by the energy storage device 120 during discharge are, respectively, tens of kilovolts and ten of kiloamperes, making the system 100 a high voltage, high current circuit.

In the system 100, each of the power source 110, the switch 200, and the load 130 is connected to ground 140. It is to be understood from FIG. 1 that alternative embodiments of the system 100 are contemplated. For example, in an exemplary alternative embodiment, the positions of the switch 200 and the energy storage device 120 are switched.

Figure 2:
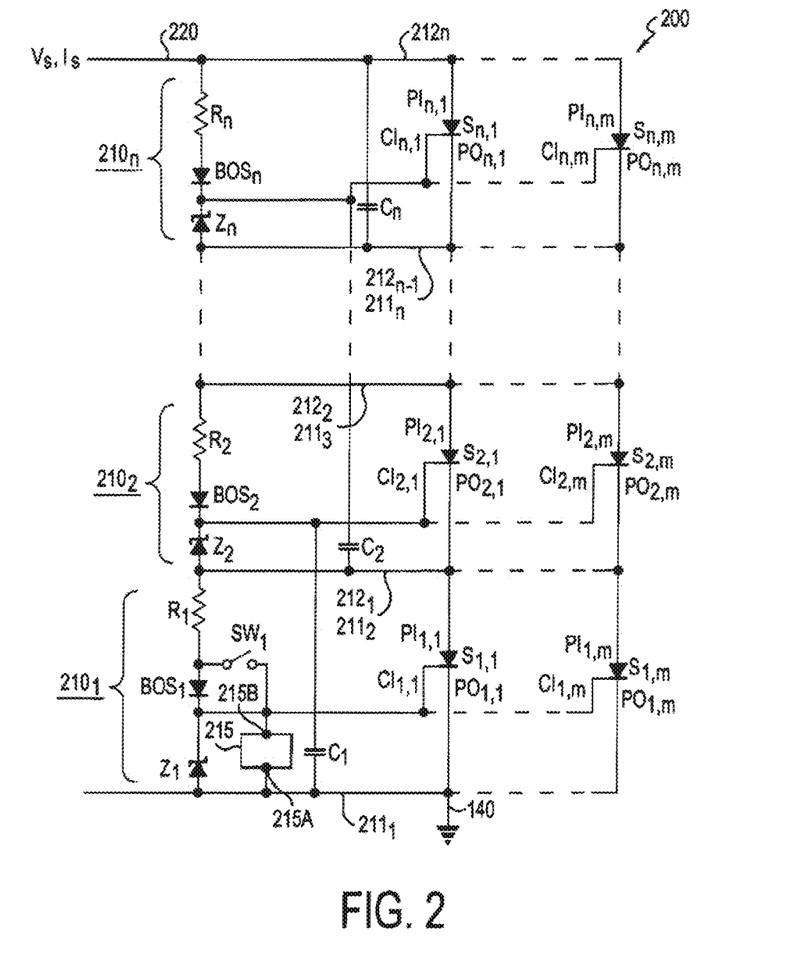
FIG. 2 illustrates an exemplary embodiment of the semiconductor switching device of FIG. 1, in accordance with an exemplary embodiment of the present invention.

Illustrated in FIG. 2 is a circuit diagram for the switch 200 of FIG. 1, in accordance with an exemplary embodiment of the present invention. The switch 200 is used for switching a current $I_S$ provided by the energy storage device 120 at a voltage $V_S$. As noted above, the current $I_S$ may be tens of kiloamperes, and the voltage $V_S$ may be tens of kilovolts.

The switch 200 comprises a plurality of levels or stages, respectively designated as $210_1, 210_2, \ldots 210_n$, connected in series. In the exemplary embodiment of the switch 200 illustrated in FIG. 2, there are n stages $210_1$ through $210_n$. By using a plurality of stages $210_1$ through $210_n$, the switch 200 divides the source voltage $V_S$ over n stages so that $V_S/n$ is less than the maximum permissible voltage across any of the stages $210_1$ through $210_n$. Thus, the switch 200 has a higher voltage hold-off capability than it would have had it had only one stage, and each stage is protected from overvoltage.

Each stage comprises a plurality of solid state semiconductor switches or devices, respectively designated as $S_{x,y}$, connected in parallel, where x refers to any of stages $210_1$ through $210_n$ and y refers to the semiconductor devices in each stage. In the exemplary embodiment of the switch 200 illustrated in FIG. 2, the first stage $210_1$ comprises m semiconductor devices $S_{1,1}$ through $S_{1,m}$ connected in parallel (herein, "$S_1$" is used as shorthand to refer to the plurality of semiconductor devices $S_{1,1}$ through $S_{1,m}$ in the stage $210_1$); the second stage $210_2$ comprises m semiconductor devices $S_{2,1}$ through $S_{2,m}$ connected in parallel (herein, "$S_2$" is used as shorthand to refer to the plurality of semiconductor devices $S_{2,1}$ through $S_{2,m}$ in the stage $210_1$); and the nth stage $210_n$ comprises m semiconductor devices $S_{n,1}$ through $S_{n,m}$ connected in parallel (herein, "$S_n$" is used as shorthand to refer to the plurality of semiconductor devices $S_{n,1}$ through $S_{n,m}$ in the stage $210_n$). By using a plurality of m semiconductor devices in each stage, the switch 200 divides the input current $I_S$ by m. Thus, each stage $210_1$ through $210_n$ and, specifically, each semiconductor device $S_{x,y}$ is protected from overcurrent.

In the exemplary embodiment illustrated in FIG. 2, the first stage $210_1$ is a control-triggered stage used to control the turn-on and turn-off of the stages $210_2$ through $210_n$ and thereby of the switch 200. FIG. 2 illustrates that the control-triggered stage $210_1$ is the first or bottommost stage and connected to ground 140. It is to be understood that the control-triggered stage $210_1$ need not be so located and could be positioned in the place of any of the other stages $210_2$ through $210_n$ in the switch 200.

The control-triggered stage $210_1$ comprises the semiconductor devices $S_{1,1}$ through $S_{1,m}$ having respective control inputs $CI_{1,1}$ through $CI_{1,m}$ power inputs $PI_{1,1}$ through $PI_{1,m}$, and power outputs $PO_{1,1}$ through $PO_{1,m}$. The power outputs $PO_{1,1}$ through $PO_{1,m}$ are connected to an output $211_1$ of the control-triggered stage $210_1$ which is at ground 140. The control-triggered stage $210_1$ further comprises a capacitor $C_1$, a turn-off circuit 215, and a suppressor $Z_1$. A first side or end of the suppressor $Z_1$ is connected to the output $211_1$, as is a first side or end of the capacitor $C_1$ and a first end 215A of the turn-off circuit 215. A second side or end of the capacitor $C_1$ is connected to the control inputs $CI_{2,1}$ through $CI_{2,m}$ of the semiconductor devices $S_{2,1}$ through $S_{2,m}$ of the second stage. A second side or end of the suppressor $Z_1$ is connected to the control inputs $CI_{1,1}$ through $CI_{1,m}$ of the semiconductor devices $S_{1,1}$ through $S_{1,m}$, as is a second end 215B of the turn-off circuit 215.

The control-triggered stage $210_1$ further comprises a breakover switch $BOS_1$, a second side or end of which is coupled to the second side of the suppressor $Z_1$. A first side or end of the breakover switch $BOS_1$ is coupled to the power inputs $PI_{1,1}$ through $PI_{1,m}$ of the semiconductor devices $S_{1,1}$ through $S_{1,m}$ via a resistor $R_1$. The power inputs $PI_{1,1}$ through $PI_{1,m}$ of the semiconductor devices $S_{1,1}$ through $S_{1,m}$ are connected to an input $212_1$ of the control-triggered stage $210_1$. A switch $SW_1$ is disposed in the control-triggered stage $210_1$ across the breakover switch $BOS_1$.

In an exemplary embodiment, the suppressor $Z_1$ is a Zener diode, the breakover switch $BOS_1$ is a breakover diode, the switch $SW_1$ is a MOSFET, and the turn-off circuit 215 is a MOSFET. The first side of the Zener diode $Z_1$, its anode, is connected to the output $211_1$ of the stage $210_1$, and the second side of the Zener diode $Z_1$, its cathode, is connected to the control inputs $CI_{1,1}$ through $CI_{1,m}$ of the semiconductor devices $S_{1,1}$ through $S_{1,m}$. The first side of the breakover switch $BOS_1$, its anode, is connected to the resistor $R_1$, and the second side of the breakover switch $BOS_1$, its cathode, is connected to the control inputs $CI_{1,1}$ through $CI_{1,m}$ of the semiconductor devices $S_{1,1}$ through $S_{1,m}$.

In this exemplary embodiment, the collector of the MOSFET $SW_1$ is connected to the anode of the breakover diode $BOS_1$, and the emitter is connected to the cathode of the breakover diode $BOS_1$. The gate of the MOSFET $SW_1$ serves as a control input to selectively turn on the switch 200. The collector of the MOSFET 215 is connected to the control inputs $CI_{1,1}$ through $CI_{1,m}$ of the semiconductor devices $S_{1,1}$ through $S_{1,m}$, and the emitter is connected to the output $211_1$ of the control-triggered stage $210_1$. The gate of the MOSFET 215 serves as a control input to selectively turn off the switch 200. The control inputs into the MOSFETS $SW_1$ and 215 are low-power inputs, which allows for low-power control of the switch 200.

Still referring to FIG. 2, the second through nth stages, $210_2$ through $210_n$, are auto-triggered stages triggered by the control-triggered stage $210_1$. The stages $210_2$ through $210_n$ are constructed similarly to the stage $210_1$ but differ in that they do not include the switch $SW_1$ or the turn-off circuit 215.

The second stage $210_2$ comprises the semiconductor devices $S_{2,1}$ through $S_{2,m}$ having respective control inputs $CI_{2,1}$ through $CI_{2,m}$, power inputs $PI_{2,1}$ through $PI_{2,m}$, and power outputs $PO_{2,1}$ through $PO_{2,m}$. The second stage $210_2$ further comprises a capacitor $C_2$, a suppressor $Z_2$, a breakover switch $BOS_2$, and a resistor $R_2$. The power outputs $PO_{2,1}$ through $PO_{2,m}$ of the semiconductor devices $S_{2,1}$ through $S_{2,m}$ are connected to an output $212_1$ of the second stage $210_2$. The output $211_2$ of the second stage $210_2$ is the input $212_1$ of the first stage $210_1$. Thus, the second stage $210_2$ is connected in series to the first stage $210_1$.

A first side or end of the suppressor $Z_2$ is connected to the output $211_2$ of the second stage $210_2$, as is a first side or end of the capacitor $C_2$. A second side or end of the suppressor $Z_2$ is connected to the control inputs $CI_{2,1}$ through $CI_{2,m}$ of the semiconductor devices $S_{2,1}$ through $S_{2,m}$ and to a second side or end of the breakover switch $BOS_2$. A first side or end of the breakover switch $BOS_2$ is coupled to the power inputs $PI_{2,1}$ through $PI_{2,m}$ of the semiconductor devices $S_{2,1}$ through $S_{2,m}$ via the resistor $R_2$. A second side or end of the capacitor $C_2$ is connected to the control input of the semiconductor devices of the next higher stage. The power inputs $PI_{2,1}$ through $PI_{2,m}$ of the semiconductor devices $S_{2,1}$ through $S_{2,m}$ are connected to the input $212_2$ of the auto-triggered stage $210_2$, which input $212_2$ is an output $211_3$ of the next higher stage.

Each next higher stage through to stage n−1 is configured the same as the stage $210_2$ (stage 2). The last stage, stage $201_n$, comprises the semiconductor devices $S_{n,1}$ through $S_{n,m}$ having respective control inputs $CI_{n,1}$ through $CI_{n,m}$, power inputs $PI_{n,1}$ through $PI_{n,m}$, and power outputs $PO_{n,1}$ through $PO_{n,m}$. The stage $201_n$ further comprises a capacitor $C_n$, a suppressor $Z_n$, a breakover switch $BOS_n$, and a resistor $R_n$. These components are connected in the same manner as those in the auto-triggered stage $210_2$, except that the second side or end of the capacitor $C_n$ is not connected to the control input of the semiconductor devices of the next higher stage as there is no next higher stage. Rather, the second side or end of the capacitor $C_n$ is connected to the input $212_n$ of the auto-triggered stage $210_n$. This input $212_n$ is connected to an input 220 of the switch 200. As with the other auto-triggered stages, the output $211_n$ of the auto-triggered stage $201_n$ is connected to the input of the next lowest stage, in this case an input $212_{n-1}$ of the auto-triggered stage $210_{n-1}$ (not illustrated).

In an exemplary embodiment, for each of the stages $210_2$ through $210_n$, the suppressors $Z_2$ through $Z_n$ are Zener diodes, and the breakover switches $BOS_2$ through $BOS_n$ are breakover diodes. The first side of each of the Zener diodes $Z_2$ through $Z_n$, its anode, is connected to the respective output $211_2$ through $211_n$ of the respective stage $210_2$ through $210_n$, and the second side of each of the Zener diodes $Z_2$ through $Z_n$, its cathode, is connected to the respective control inputs of the respective semiconductor devices $S_2$ through $S_n$. The first side of each of the breakover diodes $BOS_2$ through $BOS_n$, its anode, is connected to the respective resistor $R_2$ through $R_n$, and the second side of each of the breakover diodes $BOS_2$ through $BOS_n$, its cathode, is connected to the respective control inputs of the respective semiconductor devices $S_2$ through $S_n$.

As further shown in FIG. 2, the breakover switches $BOS_1$ through $BOS_n$ are identical, as are the respective components among the stages $210_1$ through $210_n$. The breakover switches $BOS_1$ through $BOS_n$ have a breakover voltage equal to $V_S/n + \Delta V$, where $V_S$ is the maximum voltage seen across the switch 200, n is the number of stages, and $\Delta V$ is a minimum acceptable difference in blocking voltage between a stage and its breakover switches. The breakover voltage of each of the breakover switches $BOS_1$ through $BOS_n$ is desirably $\Delta V$ greater than $V_S/n$, so that the switch 200 does not automatically turn on when $V_S$ is applied at its input 220. For example, if the switch 200 comprises 5 levels, and $V_S$ is 5,000V, the maximum voltage across each stage is 1,000V, and each breakover switches $BOS_1$ through $BOS_n$ desirably has a breakover voltage greater than 1,000V. For example, the breakover voltage may be 1,007V so that $\Delta V = 7V$.

Turn-on and turn-off of the control-triggered stage $210_1$ is now described. In its initial state, the switch 200 is open and a voltage $V_S$ is present at its input 220 by the energy storage device 120. The voltage drop across each stage is equal to $V_S/n$, and each capacitor $C_1$ through $C_n$ is fully charged. Each breakover diode $BOS_1$ through $BOS_n$ desirably has a breakover voltage greater than $V_S/n$ but less than $V_S/(n-1)$, so that once one stage turns on, all stages turn on. The voltage drop $V_S/n$ across each stage is distributed over the suppressor, the breakover switch, and the resistor of each respective stage.

Turn-on of the control-triggered stage $210_1$ and the auto-triggered stages $210_2$ through $210_n$ is now described. In the description below, the voltage across each stage $210_1$ through $210_n$ is, respectively, $\Delta V_{S1}$ through $\Delta V_{Sn}$, each of which is equal to $V_S/n$ when the switch 200 is off. Current $I_S$ is then zero because the switch 200 is off because the stages $210_1$ through $210_n$ are in a non-conducting (off) state. The voltage $\Delta V_{S1}$ through $\Delta V_{Sn}$ across each stage $210_1$ through $210_n$ when the switch 200 is turned on is, respectively $V_{Saturation-1}$ through $V_{Saturation-n}$, the voltages across each of the semiconductor devices $S_1$ through $S_n$ while in saturation. Current $I_S$ is then non-zero because the switch 200 is on because all of the stages $210_1$ through $210_n$ are conducting, i.e., in an on state. The switch 200 is not turned on until each stage $210_1$ through $210_n$ is conducting (turned on).

Turn-on of the control-triggered stage $210_1$ begins with each of the semiconductor devices $S_{1,1}$ through $S_{1,m}$ in a non-conducting (off) state such that the stage $210_1$ is in a non-conducting (off) state. The control-triggered stage $210_1$ operates as follows during turn-on:

a) In response to a control signal, for example supplied to the switch $SW_1$, the switch $SW_1$ across the breakover switch $BOS_1$ is closed, thereby shorting the first side of the breakover switch $BOS_1$ to its second side.

b) The voltage drop $\Delta V_{S1}$ across the stage $210_1$ instantaneously decreases slightly and is redistributed over the resistor $R_1$ and the suppressor $Z_1$.

c) The voltage at the control inputs $CI_{1,1}$ through $CI_{1,m}$ of the semiconductor devices $S_{1,1}$ through $S_{1,m}$ instantaneously increases, i.e., a positive voltage pulse is provided to control inputs $CI_{1,1}$ through $CI_{1,m}$ of the semiconductor devices $S_{1,1}$ through $S_{1,m}$.

d) The positive voltage pulse at the control inputs $CI_{1,1}$ through $CI_{1,m}$ of the semiconductor devices $S_{1,1}$ through $S_{1,m}$ turns on the semiconductor devices $S_{1,1}$ through $S_{1,m}$ and places them into saturation. The control-triggered stage $210_1$ is thereby turned on.

Because the semiconductor devices $S_{1,1}$ through $S_{1,m}$ turn on and go into saturation, the voltage at the power inputs $PI_{1,1}$ through $PI_{1,m}$ of the semiconductor devices $S_{1,1}$ through $S_{1,m}$ decreases, thereby pulling down the voltage at the input $212_1$ of the control-triggered stage $210_1$ and at the output $211_2$ of the auto-triggered stage $210_2$. The voltage $\Delta V_{S1}$ across the stage $210_1$ is $V_{Saturation-1}$ after turn-on. Because the remaining stages $210_2$ through $210_n$ are still in the off state and the total voltage $V_S$ across the switch 200 remains the same, the voltages $\Delta V_{S2}$ through $\Delta V_{Sn}$ across respective stages $210_2$ through $210_n$ increase after the switch $SW_1$ closes and the semiconductor devices $S_{1,1}$ through $S_{1,m}$ turn on.

After the stage $210_1$ is turned on, the voltage $\Delta V_{S2}$ through $\Delta V_{Sn}$ across each respective stage $210_2$ through $210_n$ is $(V_S - V_{Saturation-1})/(n-1)$. In other words, the voltage $\Delta V_{S2}$ through $\Delta V_{Sn}$ across each respective stage $210_2$ through $210_n$ increases to $(V_S - V_{Saturation-1})/(n-1)$, where $(V_S - V_{Saturation-1})/(n-1) > V_S/n$ because $V_{Saturation-1} < V_S/n$. This increase in voltage $\Delta V_{S2}$ through $\Delta V_{Sn}$ across each respective stage $210_2$ through $210_n$ causes the stages $210_2$ through $210_n$ to turn on by one of two ways: via turn-on of the breakover switches $BOS_2$ through $BOS_n$ or via the capacitors $C_2$ through $C_n$ discharging into the control inputs of their respective semiconductor devices.

Following turn-on of the control-triggered stage $210_1$, if the voltage $\Delta V_{S2}$ through $\Delta V_{Sn}$ across each of the respective stages $210_2$ through $210_n$ causes the voltage $\Delta V_{BOS2}$ through $\Delta V_{BOSn}$ across each respective breakover switch $BOS_2$ through $BOS_n$ to exceed the breakover voltage $(V_S/n + \Delta V)$ of each of the breakover switches $BOS_2$ through $BOS_n$, turn-on of the auto-triggered stages $210_2$ through $210_n$ proceeds as follows ("the first auto turn-on procedure"):

a) Each of the breakover switches $BOS_2$ through $BOS_n$ begins conducting at the same time.

b) $\Delta V_{BOS2}$ through $\Delta V_{BOSn}$ decreases because breakover switches $BOS_2$ through $BOS_n$ begin conducting.

c) The voltage drops $\Delta V_{S2}$ through $\Delta V_{Sn}$ across the respective stages $210_2$ through $210_n$ instantaneously redistribute over the respective resistors $R_2$ through $R_n$ and the suppressors $Z_2$ through $Z_n$.

d) The voltages at the control inputs of the semiconductor devices $S_2$ through $S_n$ instantaneously increase, i.e., positive voltage pulses are provided to control inputs of the semiconductor devices $S_2$ through $S_n$.

e) The positive voltage pulses at the control inputs $CI_{2,1}$ through $CI_{2,m}$ of the semiconductor devices $S_2$ through $S_n$ turn on the semiconductor devices $S_2$ through $S_n$ and place them into saturation.

f) Because the semiconductor devices $S_2$ through $S_n$ turn on and go into saturation, the voltages at the power inputs of the semiconductor devices $S_2$ through $S_n$ decrease, thereby pulling down the respective voltages at the respective inputs $212_2$ through $212_n$ of the respective stages $210_2$ through $210_n$. The voltages $\Delta V_{S2}$ through $\Delta V_{Sn}$ across the respective stages $210_1$ through $210_n$ are, respectively, $V_{Saturation-2}$ through $V_{Saturation-n}$ after turn-on.

g) The voltage $\Delta V_S$ across the switch 200 decreases to $V_{Saturation-1} + V_{Saturation-2} + \ldots + V_{Saturation-n}$ and $I_S$ increases from zero.

Following turn-on of the control-triggered stage $210_1$, if the voltage $\Delta V_{S2}$ through $\Delta V_{Sn}$ across each of the respective stages $210_2$ through $210_n$ does not cause the voltage $\Delta V_{BOS2}$ through $\Delta V_{BOSn}$ across each respective breakover switch $BOS_2$ through $BOS_n$ to exceed the breakover voltage $(V_S/n+\Delta V)$ of each of the breakover switches $BOS_2$ through $BOS_n$, turn-on of the auto-triggered stage $210_2$ proceeds as follows ("the second auto turn-on procedure"):

a) After the control-input stage $210_1$ turns on, the voltage $\Delta V_{S1}$ decreases to $V_{Saturation-1}$ and the voltages $\Delta V_{S2}$ through $\Delta V_{Sn}$ across the remaining stages increase to $(V_S - V_{Saturation-1})/(n-1)$.

b) The voltages across the resistor $R_2$, the breakover switch $BOS_2$, and the suppressor $Z_2$ increase.

c) The capacitor $C_2$ discharges into the control inputs $CI_{2,1}$ through $CI_{2,m}$ of the semiconductor devices $S_{2,1}$ through $S_{2,m}$.

d) The semiconductor devices $S_{2,1}$ through $S_{2,m}$ turn on and go into saturation. The auto-triggered stage $210_2$ is thereby turned on.

Because the semiconductor devices $S_{2,1}$ through $S_{2,m}$ turn on and go into saturation, the voltage at the power inputs $PI_{2,1}$ through $PI_{2,m}$ of the semiconductor devices $S_{2,1}$ through $S_{2,m}$, decrease, thereby pulling down the voltage at the input $212_2$ of the auto-triggered stage $210_2$ and at the output $211_3$ of the auto-triggered stage $210_3$. The voltage $\Delta V_{S2}$ across the stage $210_2$ is $V_{Saturation-2}$ after turn-on. Because the remaining stages $210_3$ through $210_n$ are still in the off state and the total voltage $V_S$ across the switch $200$ remains the same, the voltages $\Delta V_{S3}$ through $\Delta V_{Sn}$ across respective stages $210_3$ through $210_n$ increase after the auto-triggered stage $210_2$ turns on.

After the auto-triggered stage $210_2$ turns on according to the second auto turn-on procedure, the capacitor $C_3$ begins to discharge into the control inputs $CI_{3,1}$ through $CI_{3,m}$ of the semiconductor devices $S_{3,1}$ through $S_{3,m}$. The auto-triggered stages $210_3$ through $210_n$ start to cascade on according to the second auto turn-on procedure. However, turn-on of any of the auto-triggered stages $210_3$ through $210_n$ progresses according to the first turn-on procedure if the voltages across the remaining breakover switches are exceeded. Thus, cascading turn-on may shift to simultaneous turn-on once the breakover voltages of the remaining breakover switches are exceeded.

The suppressors $Z_1$ through $Z_n$ provide protection for the control-input-to-power-output junctions of the semiconductor devices $S_1$ through $S_n$ against overcurrent and overvoltage during switching of the switch $200$ on and off. The breakover switches $BOS_1$ through $BOS_n$ also provide protection for each of the levels $210_1$ through $210_n$ from overvoltage when the switch $200$ is off and while it is being turned on. Protection from overvoltage during turn-on is desirable as the voltages across levels that are not on increase as other levels are turned on. Thus, the switch $200$ is able to handle voltages $V_S$ in the level of 10 s of kilovolts.

As noted above, the semiconductor devices $S_1$ through $S_n$ are desirably distributed m per stage, although differing numbers of semiconductor devices per stage are contemplated. Thus, the current $I_S$ is divided across m semiconductors in each of stages $210_1$ through $210_n$. Accordingly, the switch $200$ is able to handle currents $I_S$ in the level of 10 s of kiloamps.

Turn-off of the switch $200$ proceeds as follows:

a) In response to a control signal, for example supplied to the turn-off circuit $215$, the turn-off circuit $215$ provides a negative-voltage signal to the control inputs $CI_{1,1}$ through $CI_{1,m}$ of the semiconductor devices $S_{1,1}$ through $S_{1,m}$, for example by pulling the control inputs to ground $140$.

b) The negative voltage pulse at the control inputs $CI_{1,1}$ through $CI_{1,m}$ of the semiconductor devices $S_{1,1}$ through $S_{1,m}$ turns of the semiconductor devices $S_{1,1}$ through $S_{1,m}$.

c) Because the semiconductor devices $S_{1,1}$ through $S_{1,m}$ turn off, the voltage at the power inputs $PI_{1,1}$ through $PI_{1,m}$ of the semiconductor devices $S_{1,1}$ through $S_{1,m}$ increases, thereby causing the voltage at the input $212_1$ of the control-triggered stage $210_1$ and at the output $211_2$ of the auto-triggered stage $210_2$ to rise. The voltage $\Delta V_{S1}$ across the stage $210_1$ increases, and the voltage $\Delta V_{S2}$ across the stage $210_2$ decreases.

d) Negative current from the control inputs $CI_{2,1}$ through $CI_{2,m}$ of the semiconductor devices $S_{2,1}$ through $S_{2,m}$ charges the capacitor $C_1$ providing a negative-voltage signal to the control inputs $CI_{2,1}$ through $CI_{2,m}$ of the semiconductor devices $S_{2,1}$ through $S_{2,m}$.

e) The semiconductor devices $S_{2,1}$ through $S_{2,m}$ turn off.

f) Steps (c) through (e) repeat for each next higher stage, so that the stages $210_3$ through $210_n$ cascade off until all of the stages of the switch $200$ are turned off.

Turn-on and turn-off of the switch $200$ does not require the use of a pulse transformer for each stage $210_1$ through $210_n$. As noted above, pulse transformers are bulky and require isolation from one another, increasing the size and complexity of the switch. Further, pulse transformers have non-negligible inductance, which is not desirable for high voltage, high current switches. Finally, pulse transformers provide pulses of short time periods, which may not be long enough to turn on the semiconductor devices $S_1$ through $S_n$.

By using breakover switches $BOS_1$ through $BOS_n$ and capacitors connecting the output of one level to the control inputs of the semiconductor devices of another lover, the switch $200$ provides for very fast turn-on and turn-off and avoids the use of pulse transformers. Inductance in the switch $200$ is reduced and the control inputs of the semiconductor devices $S_1$ through $S_n$ may be kept at a negative voltage for as long as is needed to turn them on. For a six level device, turn-on time may be 200 nanoseconds.

Various types of semiconductor devices are contemplated for the semiconductor devices $S_1$ through $S_n$. For example, in an exemplary embodiment, the semiconductor devices $S_1$ through $S_n$ are IGBTs. In another embodiment, they are MOSFETs. In yet another embodiment, they are SCRs. In still another embodiment, they are gate turn-off thyristors (GTOs). In a further embodiment, they are MOS controlled thyristors or light-controlled thyristors. It is to be understood that the anodes or collectors of such devices are the power inputs, as that term is used herein, the cathodes or emitters of such devices are the power outputs, as that term is used herein, and the gates of such devices are the control inputs, as that term is used herein.

The semiconductor devices $S_1$ through $S_n$ desirably have low output impedances when on. For example, in an exemplary embodiment, the semiconductor devices $S_1$ through $S_n$ desirably have output impedances in the milliohm region, and, when off, they desirably have output impedances greater than 5,000 ohms. The input impedances of the semiconductor devices $S_1$ through $S_n$ depend on the type of semiconductor device employed. If the semiconductor devices $S_1$ through $S_n$ are MOSFETs, then the input impedances are in the megohm region. If they are thyristors, then the input impedances are in the milliohm region.

In the embodiments of the switch $200$ described herein, the switch $200$ may include the suppressors $Z_1$ through $Z_n$ to protect the semiconductor devices $S_1$ through $S_n$ against overcurrent and overvoltage during turn-on and turn-off. In an exemplary embodiment, the semiconductor devices $S_1$ through $S_n$ include gate-to-cathode junctions, and the suppressors $Z_1$ through $Z_n$ provide protection for these gate-to-cathode junctions against overcurrent and overvoltage during switching of the switch 200 on and off. It is to be understood that other embodiments of the switch 200 are contemplated in which the suppressors $Z_1$ through $Z_n$ are not included.

It is further to be understood that the breakover switches $BOS_1$ through $BOS_n$ also provide protection for each of the levels $210_1$ through $210_n$ from overvoltage when the switch 200 is off and while it is being turned on. Protection from overvoltage during turn-on is desirable as the voltages across levels that are not on increase as other levels are turned on. Thus, the switch 200 is able to handle voltages $V_S$ in the level of 10 s of kilovolts.

Figure 3:
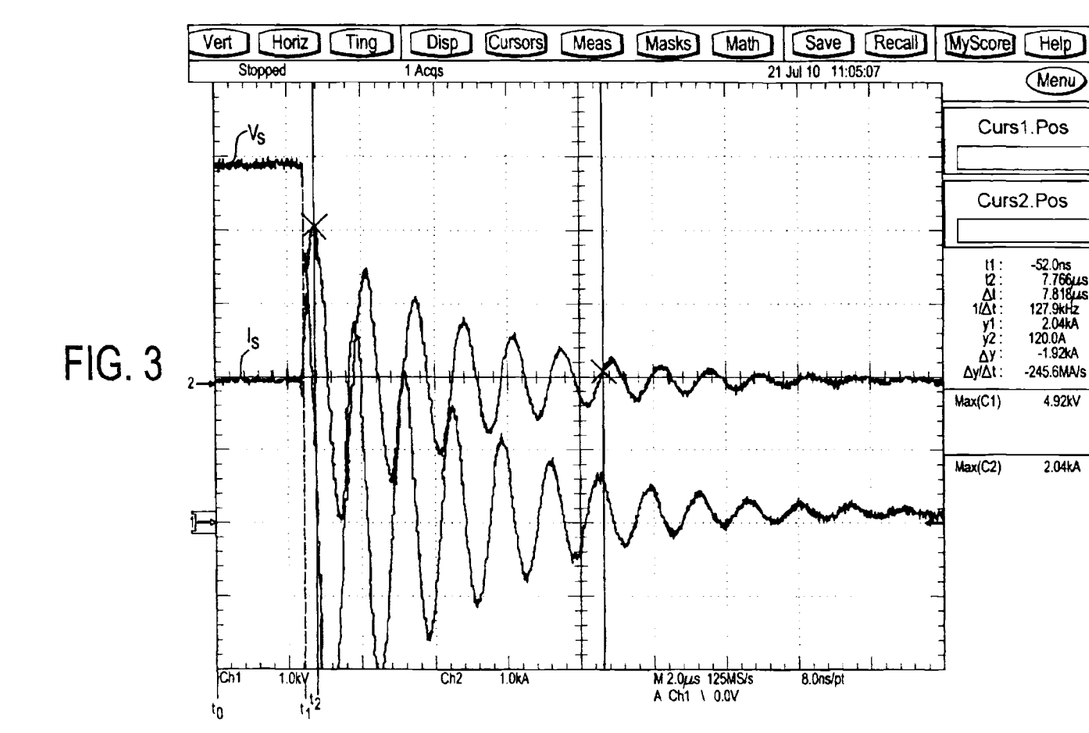
FIG. 3 illustrates exemplary waveforms for voltage and current provided by the energy storage device of FIG. 1 during turn-on of the semiconductor switching device, in accordance with an exemplary embodiment of the present invention.

In an exemplary embodiment, the energy storage device 120 is a capacitor. FIG. 3 illustrates the waves for the voltage $V_S$ across an exemplary embodiment of the energy storage device 120 and the current $I_S$ supplied by the exemplary energy storage device 120 as an exemplary embodiment of the switch 200 is turned on, in accordance with an exemplary embodiment of the present invention. For the example illustrated in FIG. 3, the energy storage device 120 is a 0.15 µF capacitor.

Referring to FIG. 3, prior to the exemplary switch 200 closing, $V_S$ is 4.92 kV and $I_S$ is 0 A. At time $t_0$, corresponding to 0 seconds, a command signal is sent to the switch $SW_1$ to close, beginning the turn-on process of the exemplary switch 200. At time $t_1$, corresponding to 40 ns, the exemplary switch 200 is fully turned on, and the exemplary energy storage device 120 begins discharging. $I_S$ increases to a maximum of 2.04 kA at time $t_2$, corresponding to 48 ns. $V_S$ and $I_S$ then oscillate until settling at zero.

Figure 4:
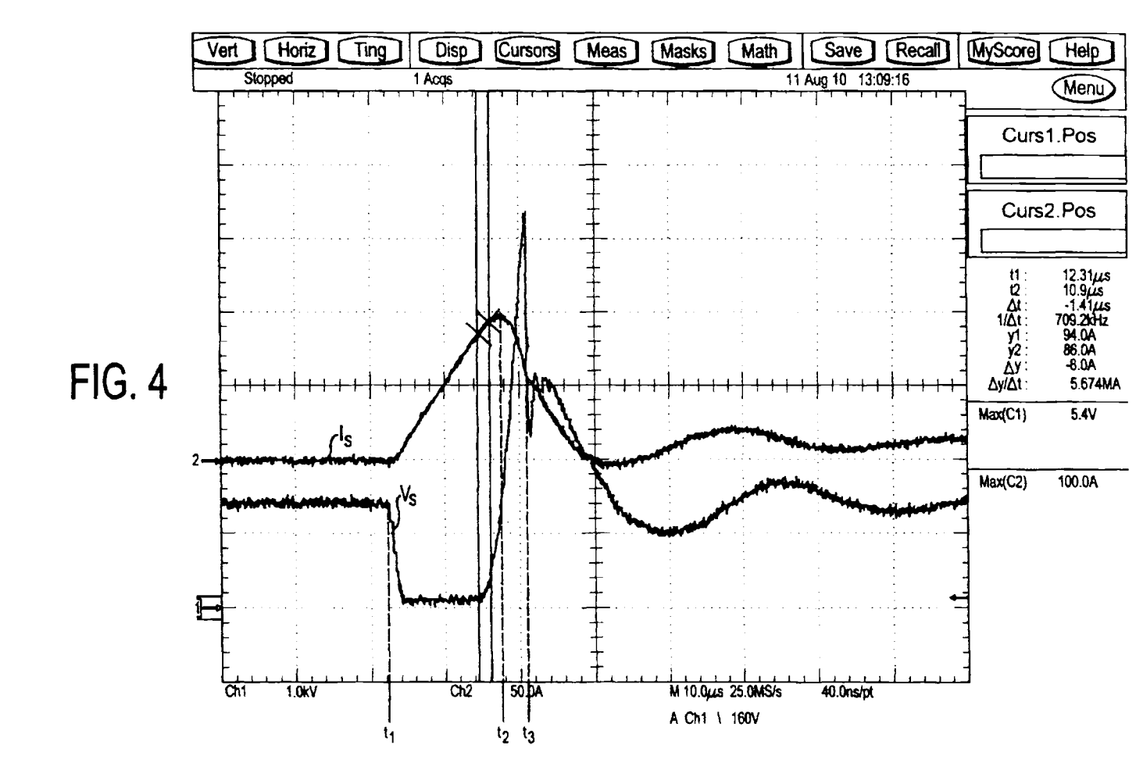
FIG. 4 illustrates exemplary waveforms for voltage and current provided by the energy storage device of FIG. 1 during turn-off of the semiconductor switching device, in accordance with an exemplary embodiment of the present invention.

FIG. 4 illustrates the waves for the voltage $V_S$ across another exemplary embodiment of the energy storage device 120 and the current $I_S$ supplied by the exemplary energy storage device 120 as another exemplary embodiment of the switch 200 is turned on and then turned off, in accordance with an exemplary embodiment of the present invention. In FIG. 4, prior to the exemplary switch 200 closing, $V_S$ is about 1.4 kV and $I_S$ is 0 A. At time $t_1$, the exemplary switch 200 is fully turned on, and the exemplary energy storage device 120 begins discharging. $I_S$ increases to a maximum of 100 A at time $t_2$, at which time the exemplary switch 200 is provided with a turn-off signal via the turn-off circuit 215. The exemplary switch 200 turns off, as described above. As the exemplary switch 200 turns off, $I_S$ decreases, and $V_S$ spikes to 5.4 kV at time $t_3$ before returning to 1.4 kV when the exemplary switch 200 is fully closed.

These and other advantages of the present invention will be apparent to those skilled in the art from the foregoing specification. Accordingly, it is to be recognized by those skilled in the art that changes or modifications may be made to the above-described embodiments without departing from the broad inventive concepts of the invention. It is to be understood that this invention is not limited to the particular embodiments described herein, but is intended to include all changes and modifications that are within the scope and spirit of the invention.

What is claimed is:

1. A semiconductor switching device comprising:
   a control-triggered stage comprising:
      a plurality of semiconductor devices connected in parallel, each semiconductor device comprising a power input, a power output, and a control input; and
      a control switch coupled to the control input of each semiconductor device, the control switch configured for turning on each semiconductor device; and
   one or more auto-triggered stages, each respective auto-triggered stage comprising:
      a plurality of semiconductor devices connected in parallel, each semiconductor device of the respective auto-triggered stage comprising a power input, a power output, and a control input; and
      a breakover switch comprising a first end and a second end, the first end of the breakover switch of the respective auto-triggered stage coupled to the power input of each semiconductor device of the respective auto-triggered stage, the second end of the breakover switch of the respective auto-triggered stage coupled to the control input of each semiconductor device of the respective auto-triggered stage,
   wherein the control-triggered stage is connected in series with one of the one or more auto-triggered stages and the one or more auto-triggered stages are connected in series, and
   wherein the one or more auto-triggered stages are configured to turn on when the control-triggered stage turns on.

2. The semiconductor switching device of claim 1, wherein the control-triggered stage further comprises:
   a breakover switch comprising a first end and a second end, the first end of the breakover switch coupled to the power input of each semiconductor device of the control-triggered stage, the second end of the breakover switch coupled to the control input of each semiconductor device of the control-triggered stage; and
   a suppressor comprising a first end and a second end, the first end of the suppressor coupled to the power output of each semiconductor device of the control-triggered stage, the second end of the suppressor coupled to the control input of each semiconductor device of the control-triggered stage.

3. The semiconductor switching device of claim 2, wherein:
   the control-triggered stage further comprises a resistor; and
   the first end of the breakover switch of the control-triggered stage is coupled to the power input of each semiconductor device of the control-triggered stage via the resistor of the control-triggered stage.

4. The semiconductor switching device of claim 2, wherein the control-triggered stage further comprises a turn-off circuit connected across the suppressor.

5. The semiconductor switching device of claim 2, wherein each breakover switch is a breakover diode.

6. The semiconductor switching device of claim 1, wherein each respective auto-triggered stage further comprises:
   a suppressor comprising a first end and a second end, the first end of the suppressor coupled to the power output of each semiconductor device of the respective auto-triggered stage, the second end of the suppressor coupled to the control input of each semiconductor device of the respective auto-triggered stage.

7. The semiconductor switching device of claim 1, wherein:
   each respective auto-triggered stage comprises a respective resistor; and
   the first end of the breakover switch of each respective auto-triggered stage is coupled to the power input of each semiconductor device of the respective auto-triggered stage via the respective resistor of the respective auto-triggered stage.

8. The semiconductor switching device of claim 1, wherein each breakover switch is a breakover diode.

9. The semiconductor switching device of claim 1, wherein the control-triggered stage further comprises a capacitor having a first end and a second end, the first end of the capacitor coupled to the power output of each semiconductor device of the control-triggered stage and the second end of the capacitor coupled to the control input of each semiconductor device of the one of the one or more auto-triggered stages, the capacitor configured to discharge into the control input of the each semiconductor device of the one of the one or more auto-triggered stages to turn on the each semiconductor device of the one of the one or more auto-triggered stages in response to the control switch closing.

10. The semiconductor switching device of claim 9, wherein:
the one or more auto-triggered stages comprise a plurality of the auto-triggered stages;
each respective auto-triggered stage comprises a capacitor having a first end and a second end;
the first end of the capacitor of each respective auto-triggered stage is coupled to the power output of each semiconductor device of the respective auto-triggered stage;
for each respective auto-triggered stage except a highest one of the plurality of auto-triggered stages the second end of the capacitor of the respective auto-triggered stage is coupled to the control input of each semiconductor device of a next higher one of the plurality of auto-triggered stages; and
the second end of the respective capacitor of the highest one of the plurality of auto-triggered stages is coupled to the power input of each semiconductor device of the highest one of the plurality of auto-triggered stages.

11. The semiconductor switching device of claim 1, wherein each semiconductor device has a low output impedance.

12. A semiconductor switching device comprising:
a control-triggered stage comprising:
a plurality of semiconductor devices connected in parallel, each semiconductor device comprising a power input, a power output, and a control input;
a breakover switch comprising a first end and a second end, the first end of the breakover switch coupled to the power input of each semiconductor device, the second end of the breakover switch coupled to the control input of each semiconductor device; and
a control switch connected across the breakover switch, the control switch configured for turning on each semiconductor device; and
a plurality of auto-triggered stages, each comprising:
a plurality of semiconductor devices connected in parallel, each semiconductor device of each auto-triggered stage comprising a power input, a power output, and a control input; and
a breakover switch comprising a first end and a second end, the first end of the breakover switch of the each auto-triggered stage coupled to the power input of each semiconductor device of the each auto-triggered stage, the second end of the breakover switch of the each auto-triggered stage coupled to the control input of each semiconductor device of the each auto-triggered stage,
wherein the control-triggered stage is connected in series with one of the auto-triggered stages and the auto-triggered stages are connected in series, and
wherein the auto-triggered stages are configured to turn on when the control-triggered stage turns on.

13. The semiconductor switching device of claim 12, wherein the control-triggered stage further comprises:
a suppressor comprising a first end and a second end, the first end of the suppressor coupled to the power output of each semiconductor device of the control-triggered stage, the second end of the suppressor coupled to the control input of each semiconductor device of the control-triggered stage.

14. The semiconductor switching device of claim 13, wherein:
the control-triggered stage further comprises a resistor; and
the first end of the breakover switch of the control-triggered stage is coupled to the power input of each semiconductor device of the control-triggered stage via the resistor of the control-triggered stage.

15. The semiconductor switching device of claim 13, wherein the control-triggered stage further comprises a turn-off circuit connected across the suppressor.

16. The semiconductor switching device of claim 12, wherein each breakover switch is a breakover diode.

17. The semiconductor switching device of claim 12, wherein the each auto-triggered stage further comprises:
a suppressor comprising a first end and a second end, the first end of the suppressor coupled to the power output of each semiconductor device of the each auto-triggered stage, the second end of the suppressor coupled to the control input of each semiconductor device of the each auto-triggered stage.

18. The semiconductor switching device of claim 17, wherein:
the each auto-triggered stage comprises a respective resistor; and
the first end of the breakover switch of the each auto-triggered stage is coupled to the power input of each semiconductor device of the each auto-triggered stage via the respective resistor of the each auto-triggered stage.

19. The semiconductor switching device of claim 12, wherein each breakover switch is a breakover diode.

20. The semiconductor switching device of claim 12, wherein the control-triggered stage further comprises a capacitor having a first end and a second end, the first end of the capacitor coupled to the power output of each semiconductor device of the control-triggered stage and the second end of the capacitor coupled to the control input of each semiconductor device of the one of the auto-triggered stages, the capacitor configured to discharge into the control input of the each semiconductor device of the one of the auto-triggered stages to turn on the each semiconductor device of the one of the auto-triggered stages in response to the control switch closing.

21. The semiconductor switching device of claim 20, wherein:
the each auto-triggered stage comprises a respective capacitor having a first end and a second end;
the first end of the respective capacitor of the each auto-triggered stage is coupled to the power output of each semiconductor device of the each auto-triggered stage;
the second end of the respective capacitor of the each auto-triggered stage except a highest one of the auto-triggered stages is coupled to the control input of each semiconductor device of a next higher one of the auto-triggered stages; and
the second end of the respective capacitor of the highest auto-triggered stage is coupled to the power input of each semiconductor device of the highest auto-triggered stage.

22. A semiconductor switching device comprising:
a device input;
a device output;

a control-triggered stage comprising:
  an input;
  an output;
  a resistor;
  a plurality of semiconductor devices connected in parallel, each semiconductor device comprising a power input connected to the input of the control-triggered stage, a power output connected to the output of the control triggered stage, and a control input;
  a breakover switch comprising a first end and a second end, the first end of the breakover switch coupled to the power input of each semiconductor device of the control-triggered stage via the resistor, the second end of the breakover switch coupled to the control input of each semiconductor device of the control-triggered stage; and
  a control switch connected across the breakover switch, the control switch configured for turning on each semiconductor device; and
  a turn-off circuit coupled to the control input of each semiconductor device, the turn-off circuit configured for turning off each semiconductor device; and
a plurality of auto-triggered stages, each comprising:
  an input;
  an output;
  a resistor;
  a plurality of semiconductor devices connected in parallel, each semiconductor device of each auto-triggered stage comprising a power input connected to the input of the each auto-triggered stage, a power output connected to the output of the each auto-triggered stage, and a control input; and
  a breakover switch comprising a first end and a second end, the first end of the breakover switch of the each auto-triggered stage coupled to the power input of each semiconductor device of the each auto-triggered stage via the resistor of the each auto-triggered stage, the second end of the breakover switch of the each auto-triggered stage coupled to the control input of each semiconductor device of the each auto-triggered stage;
wherein the input of the control-triggered stage is connected to the output of one of the auto-triggered stages,
wherein the output of the control-triggered stage is connected to the device output,
wherein the input of each auto-triggered stage except for a highest one of the auto-triggered stages is connected to the output of a next higher one of the auto-triggered stages,
wherein the input of the highest auto-triggered stage is connect to the device input, and
wherein the auto-triggered stages are configured to turn on when the control-triggered stage turns on.

23. The semiconductor switching device of claim 22, wherein each breakover switch is a breakover diode.

24. The semiconductor switching device of claim 22, wherein:
  the control-triggered stage further comprises a suppressor comprising a first end and a second end, the first end of the suppressor coupled to the power output of each semiconductor device of the control-triggered stage, the second end of the suppressor coupled to the control input of each semiconductor device of the control-triggered stage, and
  the each auto-triggered stage further comprises a suppressor comprising a first end and a second end, the first end of the suppressor coupled to the power output of each semiconductor device of the each auto-triggered stage, the second end of the suppressor coupled to the control input of each semiconductor device of the each auto-triggered stage.

25. The semiconductor switching device of claim 22, wherein the control-triggered stage further comprises a capacitor having a first end and a second end, the first end of the capacitor coupled to the power output of each semiconductor device of the control-triggered stage and the second end of the capacitor coupled to the control input of each semiconductor device of the one of the auto-triggered stages, the capacitor configured to discharge into the control input of the each semiconductor device of the one of the auto-triggered stages to turn on the each semiconductor device of the one of the auto-triggered stages in response to the control switch closing.

26. The semiconductor switching device of claim 25, wherein:
  the each auto-triggered stage comprises a respective capacitor having a first end and a second end;
  the first end of the respective capacitor of the each auto-triggered stage is coupled to the power output of each semiconductor device of the each auto-triggered stage;
  the second end of the respective capacitor of the each auto-triggered stage except the highest auto-triggered stage is coupled to the control input of each semiconductor device of the next higher one of the auto-triggered stages connected in series with the each auto-triggered stage; and
  the second end of the capacitor of the highest auto-triggered stage is coupled to the power input of each semiconductor device of the highest auto-triggered stage.

* * * * *